United States Patent [19]

Korsh et al.

[11] Patent Number: 4,949,139
[45] Date of Patent: Aug. 14, 1990

[54] TRANSISTOR CONSTRUCTION FOR LOW NOISE OUTPUT DRIVER

[75] Inventors: George J. Korsh, Redwood City; Edward Hui, Sunnyvale, both of Calif.

[73] Assignee: Atmel Corporation, San Jose, Calif.

[21] Appl. No.: 242,708

[22] Filed: Sep. 9, 1988

[51] Int. Cl.$^5$ ............................................. H01L 29/78
[52] U.S. Cl. .................................. 357/23.14; 307/579; 307/594; 357/51
[58] Field of Search ............... 357/23.14, 51; 307/594, 307/579

[56] References Cited

U.S. PATENT DOCUMENTS

| | | | |
|---|---|---|---|
| 4,725,747 | 2/1988 | Stein et al. | 357/23.14 |
| 4,771,195 | 9/1988 | Stein | 357/23.14 |
| 4,789,793 | 12/1988 | Ehni et al. | 307/594 |

OTHER PUBLICATIONS

Will C. H. Gubbels et al., "A 40 ns/100 pF Low-Power Full-CMOS 256K (32K×8) SRAM", *IEEE Journal of Solid State Circuits*, Oct. 1987, pp. 741-747.
George Canepa et al., "A 90 ns 4M6 CMOS EPROM", *1988 IEEE International Solid-State Circuits Conference*, Feb. 1988, pp. 120-121.
Frans List et al., "A 25 ns Full-CMOS 1M6 SRAM", *1988 IEEE International Solid-State Circuits Conference*, Feb. 1988, pp. 178-179.
Hsing-San Lee et al., "An Experimental 1M6 CMOS SRAM with configurable Organization and Operation", *1988 IEEE International Solid-State Circuits Conference*, Feb. 1988, pp. 180-181.

*Primary Examiner*—Jerome Jackson, Jr.
*Attorney, Agent, or Firm*—Thomas Schneck

[57] ABSTRACT

A transistor construction having a gate electrode meandering in a serpentine manner between interlaced comb-like drain and sources electrodes. The construction is equivalent to parallel transistors with series-connected gates, and the resistivity of the gate electrode forms a RC delay line in which transistors furthest from the gate drivers lag behind those which are closest. Accordingly, the transistor construction turns on or off gradually. The construction is useful as part of a CMOS output driver to memory chips and the like where the inductance of bondwires and the package leads normally cause noise spikes. The transistor construction reduces the current slew rate during switching so that less noise occurs on the chip supply lines. Another embodiment is made up of up to four parallel connected blocks of series-connected-gates. Multiple gate turn-off drivers are provided in a modified output driver, connected in parallel to each series-connected gate block, to insure that the transistor block turns off more rapidly than it turns on.

3 Claims, 5 Drawing Sheets

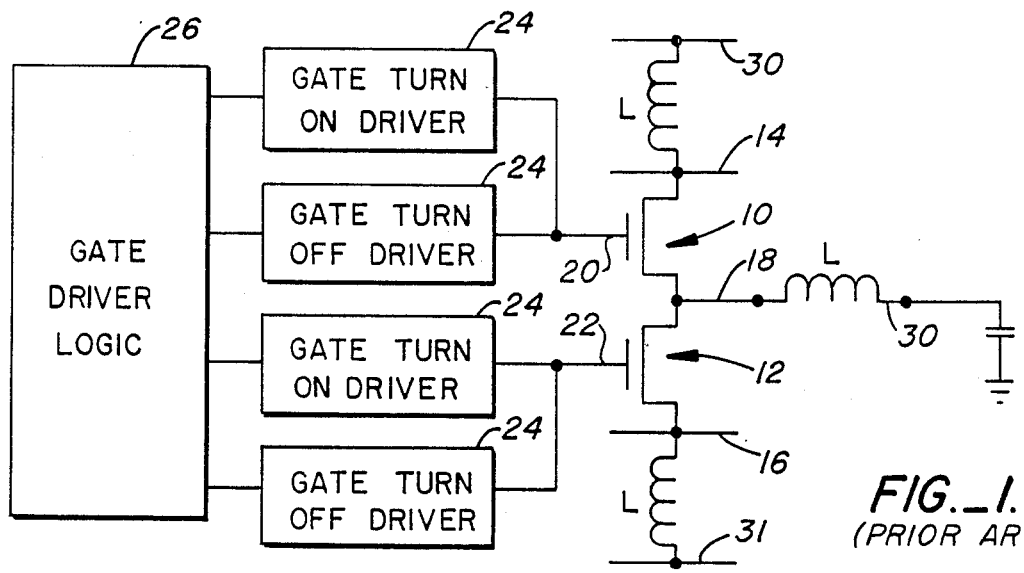
FIG._1.
(PRIOR ART)
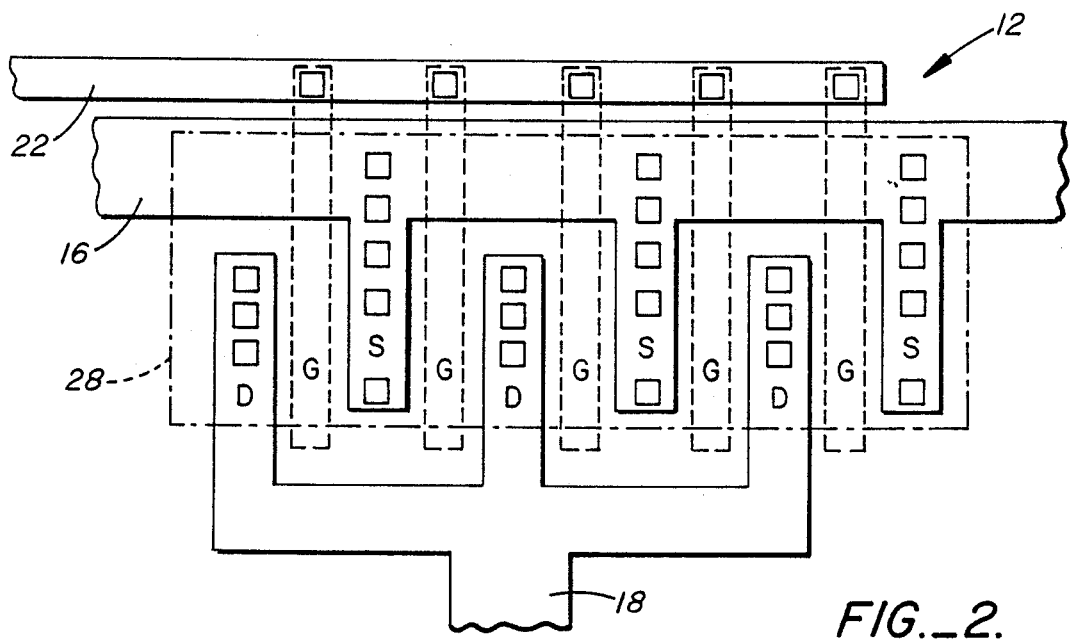
FIG._2.
(PRIOR ART)
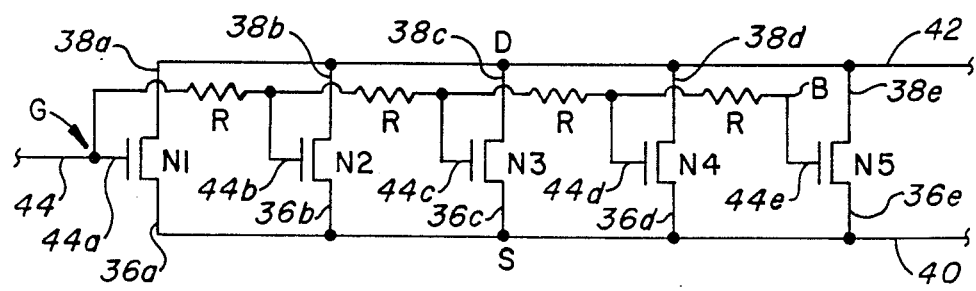
FIG._3.

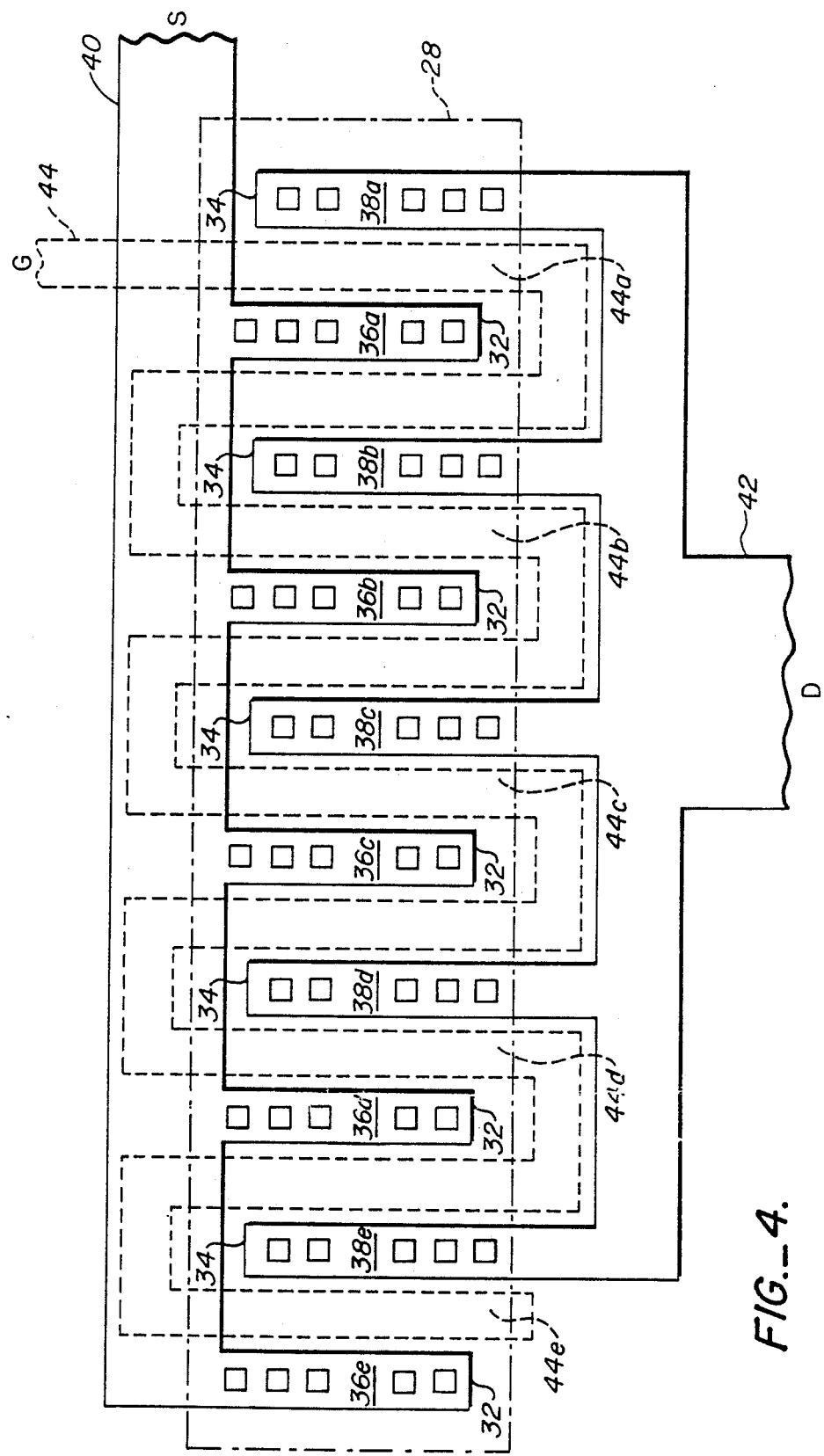
FIG._4.

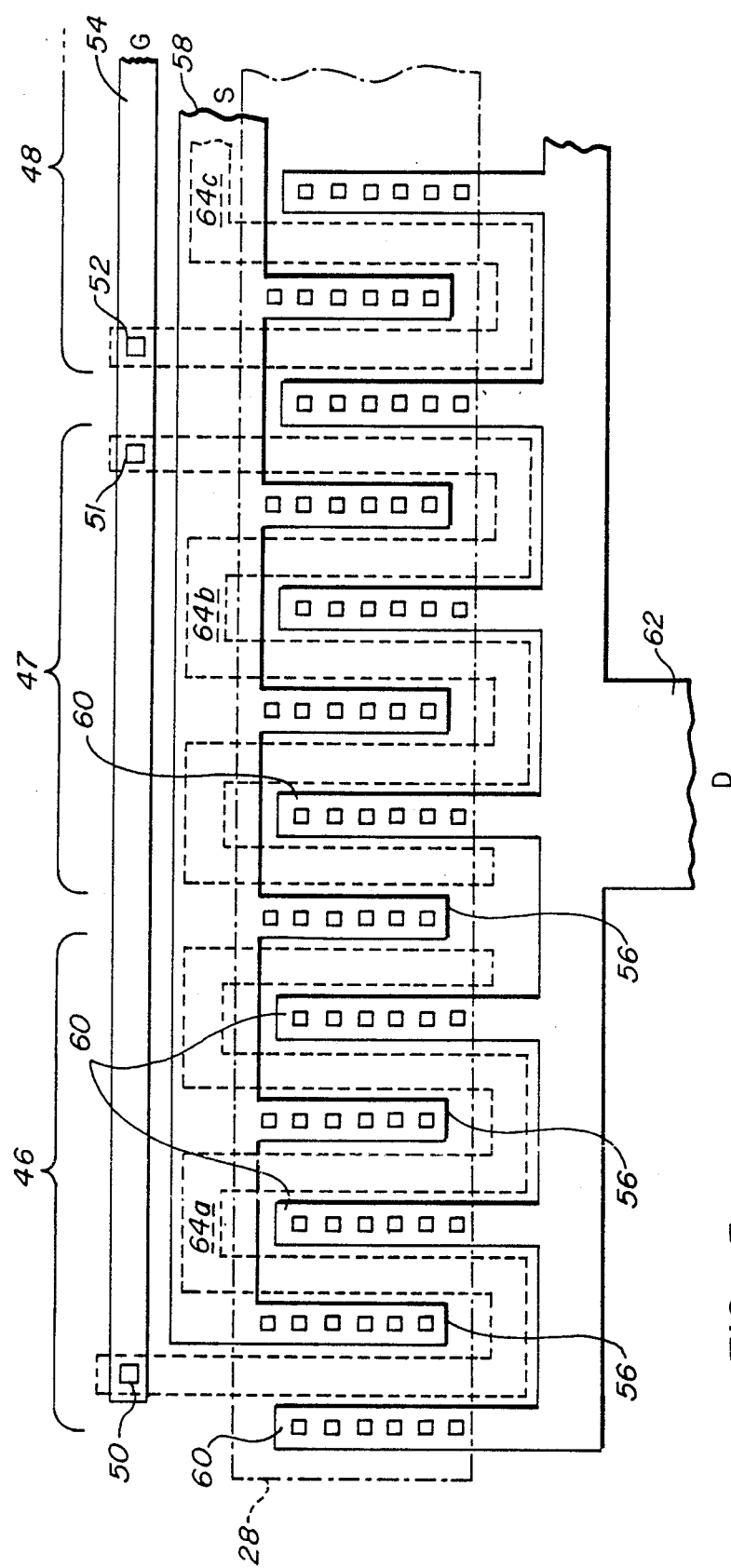
FIG._5.

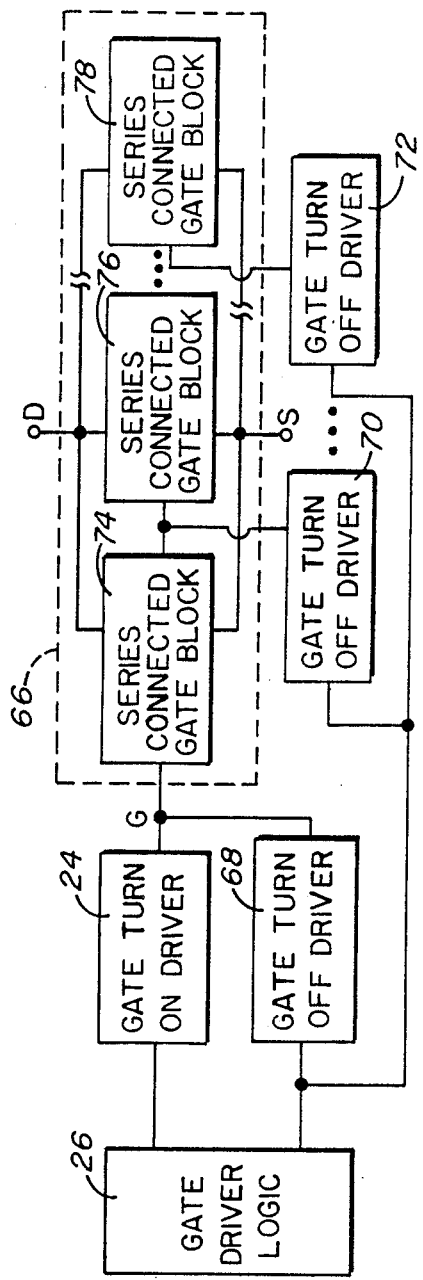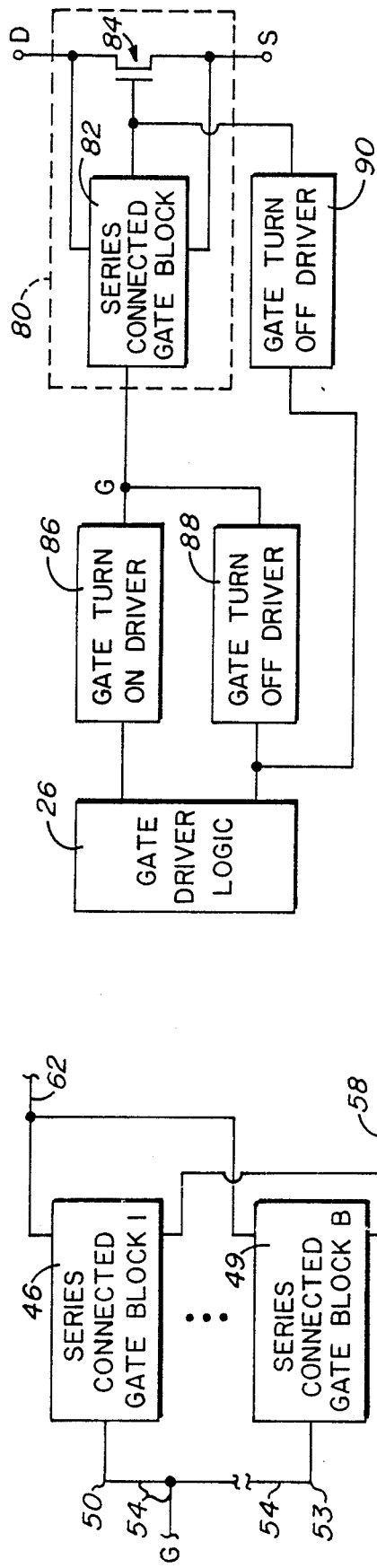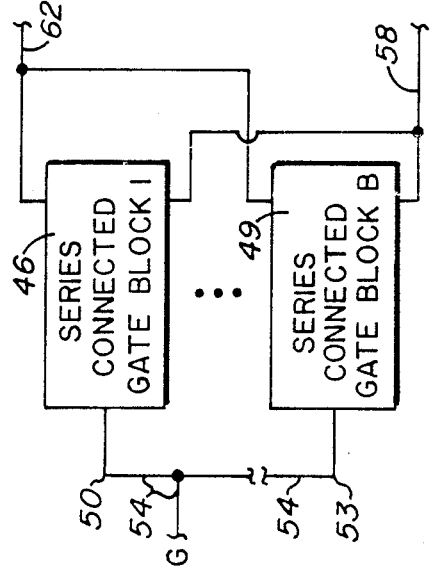
FIG._7.
FIG._8.
FIG._6.

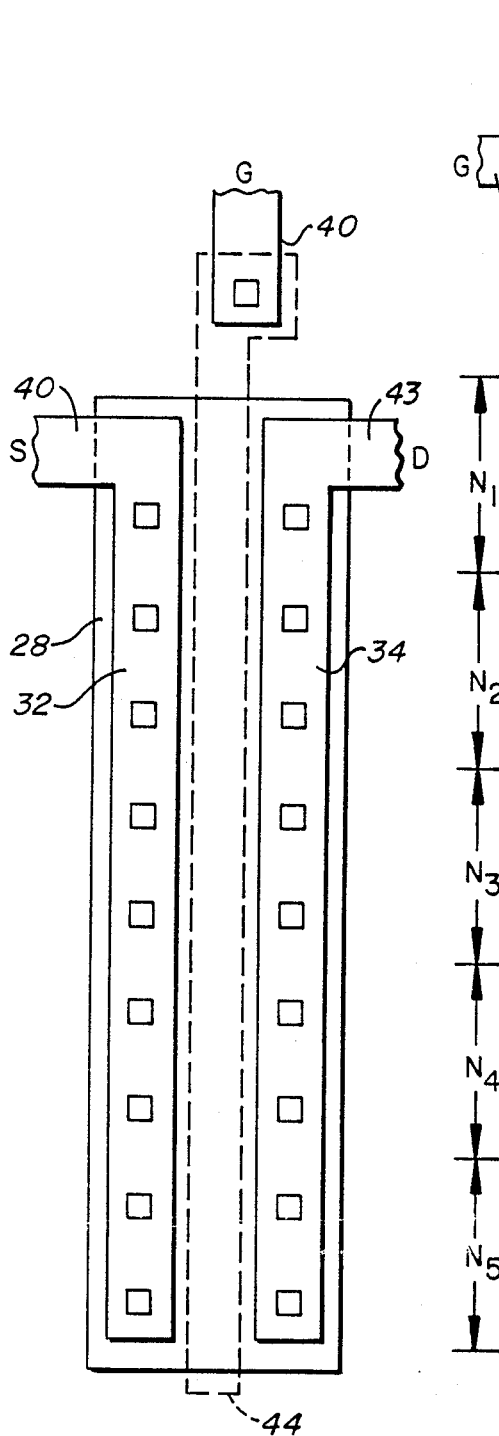
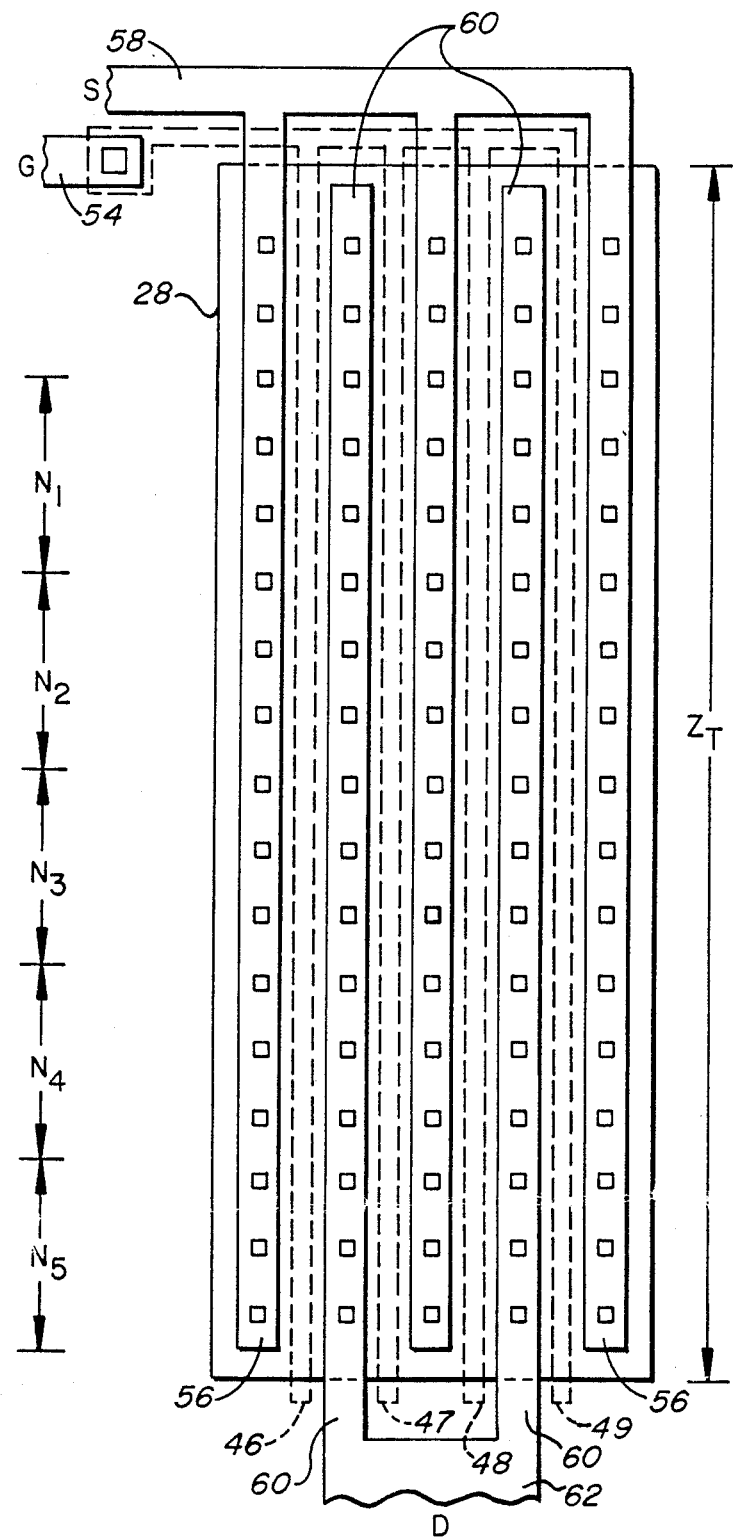
FIG._9.
FIG._10.

TRANSISTOR CONSTRUCTION FOR LOW NOISE OUTPUT DRIVER

TECHNICAL FIELD

The present invention relates to transistors and CMOS transistor circuits for memory output drivers and buffers, and in particular to transistor structures for reducing noise on a memory chip's internal power lines.

BACKGROUND ART

A conventional CMOS output driver stage for a memory chip package is shown in FIG. 1. The driver includes a p-channel transistor 10 and an n-channel transistor 12 connected in series. The sources of transistors 10 and 12 are connected to internal power lines 14 and 16 on the chip. Line 14 is a $V_{cc}$ bus, while the other line 16 is a ground bus. The drains of transistors 10 and 12 are connected together and to a common output line 18 on the chip. Each gate 20 and 22 of transistors 10 and 12 is driven by gate turn-on and turn-off drivers 24, which are controlled by gate driver logic 26. When p-channel transistor 10 is on, n-channel transistor 12 is off, and vice-versa.

A conventional transistor construction for n-and p-channel transistors 10 and 12 is shown in FIG. 2. Here, n-channel transistor 12 has a plurality of spaced apart parallel diffusion zones defined in an area 28 of a semiconductor substrate and conductive lines which contact the diffusion zones to form alternating source elements S and drain elements D. The source elements S are electrically connected in parallel to ground bus 16, and the drain elements D are likewise electrically connected in parallel to output line 18 to form interlaced comb-like source and drain electrodes. Polysilicon gate electrode elements G pass between source and drain elements S and D and are electrically connected in parallel to gate line 22 in the most direct manner possible to form a comb-like gate electrode. Each of the polysilicon gate electrode elements G are usually less than 100 microns in length to avoid RC delay in the gate.

A problem with this conventional design is the presence of unwanted and sometimes high voltage noise spikes on the $V_{cc}$ and ground lines 14 and 16 of the chip whenever the output driver stage switches to a new state. These voltage spikes become more severe as the switching time is reduced in high-speed memory chips, and their presence is especially evident in byte-wide memory designs, as when all eight outputs in an 8-bit memory switch from all zero's to all one's, or vice versa. Excessive output noise will cause a memory chip to produce erroneous data.

Referring again to FIG. 1, voltage spikes on the power lines 14 and 16 on a chip are mainly due to parasitic inductance L in the IC package leads and bond wires 30 and 31. The voltage V developed across the inductance L is given by $$V = L \frac{dI}{dt}$$

where I is the current through the output drivers and dI/dt is the change in current per unit time, also known as the output slew rate.

Noise can be reduced by reducing the output slew rate during switching. One commonly used method to reduce output slew rate is to simply reduce the size of the output transistor. This technique cannot be used where large output transistors are needed to supply large amounts of output current such as in high speed circuits. In a paper by Will C. H. Gubbels, et al., "A 40 ns/100 pF Low-Power Full-CMOS 256K (32K×8) SRAM", *IEEE Journal of Solid-State Circuits,* October 1987, pp. 741-747, constant dI/dt behavior is obtained by controlling the gate drive to the output transistor with a special drive circuit. Another approach would be to carefully scale the gate driver circuit, but this method is sensitive to processing and temperature variations. In a paper by George Canepa et al., "A 90 ns 4Mb CMOS EPROM", 1988 *IEEE International Solid-State Circuits Conference,* February 1988, pp. 120-121, the outputs are switched in succession rather than all at once to reduce the effective dI/dt seen at the inductive power busses.

An object of the present invention is to provide output driver circuit elements that reduce noise on the chip busses during output switching.

Disclosure of the Invention

The above objective has been met with a transistor construction for output drivers having a gate electrode passing between source and drain diffusion zones forming an RC delay line. When voltage is applied from a gate driver circuit, the gate RC delay line causes the output transistor to turn on gradually, and reduces the output slew rate dI/dt noise by increasing the time it takes the output transistor to turn on. The new transistor structure is equivalent to a plurality of transistors with sources and drains connected in parallel, with characteristic Z/L values that add up to the cumulative Z/L value of the prior art non-RC delay gate transistor structure, and with gates connected together in series to form the RC delay line of the new transistor structure. The parallel transistors furthest from the gate driver lag the transistors nearest the driver when turning on, because of the RC delay line affect produced by the resistance in the series connected polysilicon gates and the intrinsic gate capacitance of the transistors, so the overall transistor block turns on gradually.

The RC of each gate element delay line should be above $2 \times 10^{-9}$ seconds to provide any usable noise reduction for commonly used packages and bond wires. Therefore, the total length $Z_T$ of the gate delay line from gate driver end to unconnected end should be given by $Z_T \geq (2 \times 10^{-9} \sec/R_p C_A)^{\frac{1}{2}}$ where $R_p$ is the gate electrode sheet resistance and $C_A$ the gate capacitance per unit area. An example for 400 Å polysilicon gate oxide processing with 25 ohms per square poly sheet resistance requires a $Z_T$ over 300 microns to be useful. By comparison, normal gate layout practices require gates to be designed so that each gate element be no more than 50 to 100 microns maximum length. Additional improvements may be accomplished by using reduced Z/L transistors for the first one or two transistors nearest the gate driver. Up to four series connected RC-delay gate blocks may be connected in parallel to a common gate driver. A large Z/L transistor may be connected in parallel with its gate connected to the end of the RC-delay gate line furthest from the gate driver. Several parallel gate turn off drivers may be employed for rapidly turning off each block or subsection of the gate RC delay line, so that the "crowbar" current, produced during the transition time when both n- and p-channel transistor structures of the output driver are both on simultaneously, is greater reduced.

BRIEF DESCRIPTION OF THE DRAWINGS

FIG. 1 is a schematic of an output driver circuit of the prior art.

FIG. 2 is a top plan of a transistor construction of the prior art for either of the output transistors in the driver circuit of FIG. 1.

FIG. 3 is a schematic of a series-connected RC delay gate transistor construction which forms a block of the present invention.

FIG. 4 is a top plan of the transistor construction of FIG. 3.

FIG. 5 is a top plan of a second transistor construction of the present invention which employs up to 4 RC-delay gate blocks.

FIG. 6 is a schematic of the transistor construction of FIG. 5.

FIG. 7 is a schematic of a portion of a modified output driver circuit using a transistor construction of the present invention.

FIG. 8 is a schematic of a portion of another output driver circuit which combines an RC-delay gate block transistor of the present invention with a prior art large Z/L transistor.

FIGS. 9 and 10 are top plans of alternative transistor constructions for those shown in FIGS. 4 and 5 respectively, employing long straight gates.

BEST MODE FOR CARRYING OUT THE INVENTION

With reference to FIG. 1, a conventional CMOS output driver stage of the prior art is also used with the transistor constructions of the present invention described below. These transistor constructions substitute for both the p- and n-channel transistors 10 and 12 in the conventional driver circuit. Because the transistor constructions of the present invention, unlike the conventional construction shown in FIG. 2, turn on more slowly, the rate of change current drawn through the output driver is lower and the voltage drops across the bond wire inductances L are correspondingly lower.

With reference to FIGS. 3 and 4, a series-connected-gate block construction replaces the conventional parallel gate construction of FIG. 2 as the transistors 0 and 12 of the output driver. The construction includes a plurality of spaced apart diffusion zones 32 and 34 in an area 28 of a semiconductor substrate. Zones 32 define sources and zones 34 define drains for the transistor construction. In the example seen in FIG. 4 there are five source diffusion zones 32 and five drain diffusion zones 34 alternating with one another, but the number may vary. Three to eight source and drain diffusion zones each, are typical, however only one each is required. Aluminum or other conductive material electrode elements 36 a-e and 38 a-e make electrical contact with the diffusion zones 32 and 34. Electrode elements 36a-e are electrically connected together in parallel to a conductive line 40 to form a comb-like source electrode. Similarly, electrode elements 38 a-e are electrically connected together in parallel to an output pad 42 to form a comb-like drain electrode. The source and drain electrodes face each other and are interlaced in alternating source and drain electrode elements 36 a-e and 38 a-e, the source and drain electrode elements sequentially alternating, the same as source and drain diffusion zones 32 and 34.

A polysilicon gate electrode 44 passes between the source and drain diffusion zones 32 and 34 in an elongated serpentine pattern with a plurality of reversals in direction. A single long straight gate without reversals could also be used if only one source and one drain region were used. This meandering gate pattern defines in effect a plurality of series-connected gate electrode elements 44a-e. Resistance R between the gate electrode elements 44a-e is provided by the resistivity of the gate polysilicon and by the interconnect resistance. An RC delay line effect is produced by the series connection of "resistors" R (the polysilicon gates) and shunt "capacitors" formed by the intrinsic gate capacitance. In the case of the long straight gate construction, shown in FIG. 9, the gate resistivity alone would provide the needed resistance without the additional interconnect resistance. In that case the equivalent schematic circuit of FIG. 3 is obtained by dividing the long transistor into appropriate sections N1, N2, ..., longitudinally along the gate length direction.

In effect, the transistor construction in FIG. 4 and shown schematically in FIG. 3 is that of a block of transistors N1, N2, ..., in the present instance five transistors, connected with source and drains in parallel, but with series-connected gates. Each of the transistors N1 to N5 has a characteristic Z/L value, which together should add up to the same Z/L value of the prior art transistor construction (FIG. 2) being replaced so that both circuits have equivalent DC drive capabilities. In operation, the transistors of the present invention turn on sequentially beginning with transistor N1 nearest to the gate driver and ending with transistor N5 furthest from the gate driver. The transistor N5 turns on gradually because the gate voltage, which is steadily rising during turn-on at point B, lags behind the voltage at point G due to the RC delay line effect.

Additional improvement is accomplished by reducing the characteristic Z/L ratio of the first or first two transistors N1 or N1 and N2. This improvement is due to the fact that the worst current output slew effects, dI/dt, occurs when the first transistor N1 turns on. Reducing the overall Z/L ratio of the entire transistor block will also lower the output slew dI/dt. Another variation can have a block with a series connection of gates and a parallel-gated large Z/L transistor with its gate connected at the end of the RC delay line furthest from the gate driver. This is shown schematically in FIG. 8.

With reference to FIGS. 5 and 6, another transistor construction of the present invention has a large output transistor divided into several blocks 46, 47, 48, and 49. Each block 46-49 consists of parallel transistor elements with series-connected RC gates, as in the embodiment in FIGS. 3 and 4, and the blocks are connected in parallel at points 50-53 to a common gate driver line 54. All source electrode elements 56 are connected in parallel to a common conductive line 58 to form a comb-like source electrode. Similarly, all drain electrode elements 60 are connected in parallel to a common output pad 62 to form a comb-like drain electrode. As in the construction in FIG. 4, the comb-like source and drain electrodes face each other and are interlaced so that source and drain electrode elements 56 and 60 alternate. Four gate elements 64a-d meander in a serpentine manner between the source and drain electrode elements 56 and 60, each with one end terminated at points 50-53 on a common gate driver line 54 and with the other end not connected. Generally, not more than four parallel connected blocks 46-49 are connected to the common gate driver line 54. When more than four blocks are connected, little additional noise reduction is observed. The four parallel connected RC delay gate blocks could also be constructed, in the manner shown in FIG. 10, such that the gates 46, 47, 48 and 49 are straight without meanders, the present embodiment of the invention differing from the prior art in the length of the individual gate elements which form RC delay lines each producing greater than two nano-seconds of RC delay.

In cases where large output transistors are used and the RC delay of one or more of the series-connected-gate blocks is large, it may happen that during switching both n- and p-channel transistors of the output driver in FIG. 1 will be on at the same time. This condition is due to the delay in turning all the output transistor blocks off on one transistor type (n or p) while the other transistor type (p or n) is turning on. FIG. 7 shows a portion of a modified output driver circuit corresponding to either of the n- or p-channel transistor 10 or 12 and drivers 24 of the circuit of FIG. 1. The modified circuit has a gate turn-on driver 24 controlled by gate driver logic 26 and driving the gates of several series-connected-gate blocks connected in parallel as shown in FIGS. 5 and 6 and identified as 66 in FIG. 7, just as in the circuit of FIG. 1. However, the modified circuit has multiple gate turn-off drivers 68, 70, . . . , and 72 for each series connected gate block 74, 76, . . . , and 78 of the transistor construction 66. While the output gate charging or turn-on path remains in series, the path to discharge or turn-off the output transistor gates is now in parallel to the series connected gate blocks 74, 76, . . . , and 78 and in series within each series connected gate block. FIG. 8 shows another modified output driver circuit in which the output transistor 80 is made up of a series-connected-gate RC delay block 82 of the present invention and a large-Z/L parallel-connected-gate transistor 84 of prior art construction with the gate of transistor 84 connected at the end of the RC-delay gate line block 82. As in FIG. 7, the gate turn-on driver 86 is connected in series to the series-connected-gate block 82 and the transistor 84, while multiple gate turn-off driver 88 and 90 are connected to drive block 82 and transistor 84, respectively, in parallel.

The transistor constructions of the present invention with one or more blocks of parallel transistor elements with series-connected gates with RC delay, when replacing the output transistors of a conventional CMOS inverter type driver circuit, are effective at substantially reducing or eliminating the unwanted high voltage noise spikes on the power supply and ground lines on the chip. The resistance in the long polysilicon gates that are spaced between the interlaced comb-like drain and source electrodes combines with the shunted gate capacitance to slow the turning on or off of the transistors, reducing the output current slew rate which is the principal cause of the unwanted noise spikes. In some instances multiple gate turn-off drivers will be necessary to ensure that both output transistors in the CMOS inverter combination of the output driver are not both on simultaneously.

We claim:

1. A transistor construction with a switching delay comprising:
    (a) a semiconductor substrate
    (b) a first plurality of spaced apart diffusion zones in said semiconductor substrate electrically connected together in parallel to form a comb-like source electrode,
    (c) a second plurality of spaced apart diffusion zones in said semiconductor substrate electrically connected together in parallel to form a comb-like drain electrode, said comb-like source and drain electrodes facing each other with said first and second pluralities of spaced apart diffusion zones being interlaced and sequentially alternating with one another,
    (d) a gate electrode passing between said first and second diffusion zones in an elongated pattern, said gate electrode having a length which, together with a gate resistance R and a local transistor capacitance C, is sufficient to form an RC delay element with an RC delay of at least 2 nanoseconds.
    (e) a gate turn-on driver circuit connected to a first end of said gate electrode,
    (f) a high Z/L low RC transistor having a source and drain connected to respective comb-like source and drain electrodes, and having a control gate connected to a second end of said gate electrode distal to said first end, said control gate of said high Z/L low RC transistor being connected to said gate turn-on driver circuit only through said RC delay element formed by said gate electrode, and
    (g) gate turn-off driver circuits, at least one of said turn-off circuits connected to said gate electrode, said control gate of said high Z/L low RC transistor being directly connected to one said gate turn-off driver circuits.

2. The transistor construction of claim 1 wherein said gate electrode comprises polysilicon with a cross-sectional area selected to inherently establish said resistance R.

3. The transistor construction of claim 1 wherein the elements set forth in (a)–(g) form one transistor-driver combination in a CMOS transistor pair.

* * * * *